(12) United States Patent
Hyun

(10) Patent No.: US 7,586,169 B2
(45) Date of Patent: Sep. 8, 2009

(54) IMAGE SENSOR AND METHOD FOR MANUFACTURING THE SAME

(75) Inventor: Woo-Seok Hyun, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/963,537

(22) Filed: Dec. 21, 2007

(65) Prior Publication Data

US 2008/0173910 A1 Jul. 24, 2008

(30) Foreign Application Priority Data

Dec. 28, 2006 (KR) .................. 10-2006-0136396

(51) Int. Cl.
*H01L 27/146* (2006.01)
*H01L 31/18* (2006.01)

(52) U.S. Cl. .............. 257/432; 257/288; 257/290; 257/291; 257/292; 257/E27.132; 438/57; 438/59; 438/73

(58) Field of Classification Search ............ 257/57, 257/240, 242, 244, 60, 257, 222, 223, 225, 257/215, 229, 236, 216, 288, 290, 291, 292, 257/432, E27.131, E27.132, E27.133; 438/222, 438/223, 225, 215, 229, 236, 216, 57, 240, 438/242, 244, 60, 257, 59, 73
See application file for complete search history.

(56) References Cited

U.S. PATENT DOCUMENTS

2007/0069322 A1 * 3/2007 Jeon ..................... 257/462

FOREIGN PATENT DOCUMENTS

KR 2004093983 A * 11/2004
KR 10-2004-0093983 11/2006

* cited by examiner

*Primary Examiner*—A. Sefer
*Assistant Examiner*—Ermias Woldegeorgis
(74) *Attorney, Agent, or Firm*—Sherr & Vaughn, PLLC

(57) ABSTRACT

An image sensor that can include a photodiode formed on one side of a substrate to receive light and then generate signal charges based on the light; and a transistor converting the signal charges into predetermined voltage and transmitting the voltage to an output terminal, whereby the transistor directly contact and surrounds the photodiode.

15 Claims, 2 Drawing Sheets

IMAGE SENSOR AND METHOD FOR MANUFACTURING THE SAME

Figure 1:
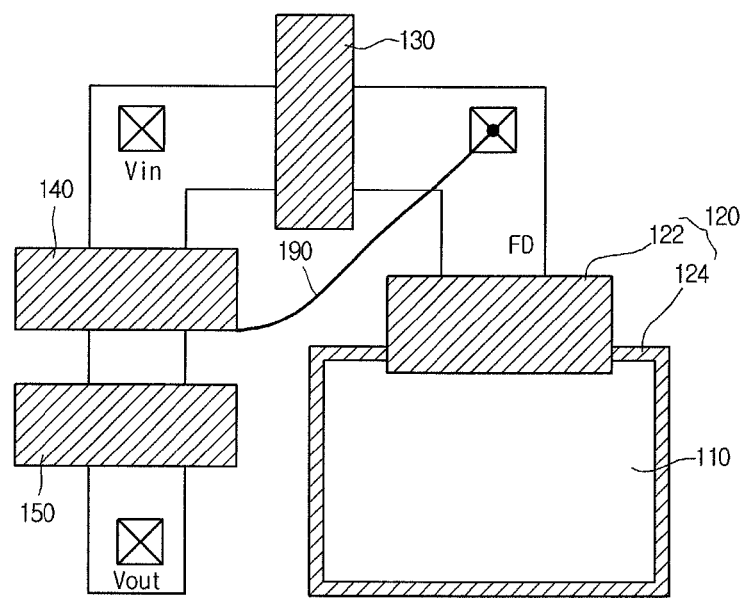

The present application claims priority under 35 U.S.C. 119 and 35 U.S.C. 365 to Korean Patent Application No. 10-2006-0136396 (filed on Dec. 28, 2006), which is hereby incorporated by reference in its entirety.

BACKGROUND

An image sensor is a semiconductor device that converts an optical image into electrical signals. An image sensor may be classified as a charge coupled device (CCD) or a complementary metal oxide silicon (CMOS) image sensor (CIS).

An image sensor may include a photodiode and a MOS transistor in each unit, and sequentially detects the electric signals of each unit pixel in a switching mode to realize images. An image sensor may include a transistor formed in a region adjacent to a photodiode, thereby transmitting electrons to an output terminal.

While there may be no problems when transmitting charges generated adjacent a transistor in real time, problems may occur in transmission of electrons adjacent edges far apart from a photodiode or in the central portion of the photodiode. Because of problems in the transmission of electrons, not only is the performance of a semiconductor device degraded, but also the sensitivity may be lowered and noise generated.

SUMMARY

Embodiments relate to an image sensor and a manufacturing method thereof having enhanced performance qualities and sensitivity provided by modifying the structure of a transistor that transfers electrons.

Embodiments relate to an image sensor that can include at least one of the following: a photodiode formed over a substrate to receive light and then generate signal charges based on the light; and a transistor converting the signal charges into predetermined voltage and transmitting the voltage to an output terminal, wherein the transistor includes a first transistor region surrounding the photodiode and directly contacting the photodiode.

Embodiments relate to an image sensor that can include at least one of the following: a photodiode formed over a substrate; and a transistor in connection with and directly contacting the photodiode.

Embodiments relate to a method for manufacturing an image sensor that can include at least one of the following steps: forming a photodiode over a substrate; and then forming a transistor directly contacting the photodiode.

DRAWINGS

Example FIGS. 1 to 4 illustrate an image sensor, in accordance with embodiments.

DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments can include a 4 T type image sensor including one photodiode and four transistors. However, embodiments can also be applied to a 1T type image sensor including one photodiode and one transistor, a 3 T type image sensor including one photodiode and three transistors, a 5 T type image sensor including one photodiode and five transistors, and the like.

As illustrated in example in FIG. 1, a unit pixel of an image sensor in accordance with embodiments can include photodiode 110 functioning as an optoelectric converter and a plurality of transistors including first transistor 120 corresponding to a transfer transistor, second transistor 130 corresponding to a reset transistor, third transistor 140 corresponding to an access transistor 140 and fourth transistor 150 corresponding to a select transistor 150.

Image sensor can further include input terminal $V_{in}$, output terminal $V_{out}$, floating diffusion region FD, connector 190 for electrically connecting floating diffusion region FD and access transistor 140.

An n-type photodiode implant and a P-type photodiode implant can be formed in photodiode 110. The P-type photodiode implant can be formed on and/or over the n-type photodiode implant. A high density n+-type photodiode implant and a low density n-type photodiode implant can be formed on and/or over floating diffusion region FD.

Particularly, the image sensor in accordance to embodiments, a transistor transmitting electrons can have a structure designed to surround a photodiode, so that a region contacting the photodiode can be widened. Such a design can serve to enhance the electron transfer capability.

Figure 4:
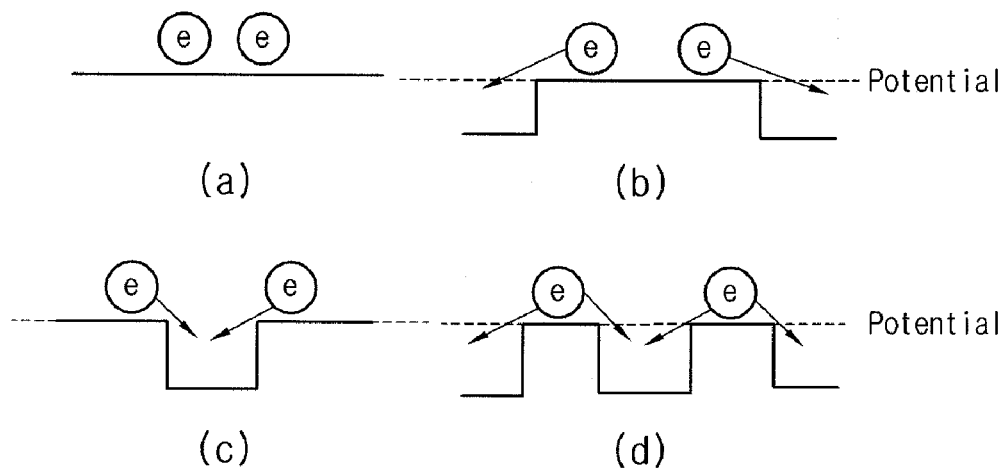

As illustrated in example FIG. 4, the structure of the transistor transmitting electrons can be designed to surround the photodiode as illustrated in example FIG. 1, to enhance the electron transfer capability in edges of the photodiode. In turn, this can also improve overall performance, increase photosensitivity and reducing noise.

Such an image sensor can be manufactured in accordance with embodiments by providing a semiconductor substrate including a first charging region, floating diffusion region FD and a photodiode region.

A low density P-type epitaxial layer can be formed on and/or over a semiconductor substrate including high density P++ type single crystalline silicon through an epitaxial process. Alternatively, a P-well can be formed in the semiconductor substrate through ion implantation. Use of an epitaxial layer or a P-well can enhance not only the performance of a low voltage photodiode for collecting photo charges, but also the photosensitivity by largely and deeply forming a depletion region in the photodiode.

A gate insulating layer and a conductive layer, e.g. a high density multi-crystalline silicon layer, can then be sequentially deposited on and/or over the entire surface of the substrate. The gate insulating layer can be formed on the semiconductor substrate through a thermal oxidation process or a chemical vapor deposition (CVD) process. The conductive layer can then be selectively removed through a photolithographic and etching process to form a gate electrode on and/or over the gate insulating layer. A silicide layer can also be formed on and/or over the gate insulating layer to form the gate electrode.

Transfer transistor 120 can include transistor 124 surrounding photodiode 110 can be formed when forming the insulating layer and the gate electrode and transistor 122 provided between photodiode 110 and FD region. An oxide layer can then be formed on and/or over the gate electrode through a thermal oxidation process. The oxide layer can function as a gate sidewall for source/drain ion implantation of transfer transistor 120.

A first photoresist layer can then be on and/or over the substrate, and exposure and development process can then be performed to cover the photodiode region. A patterning process can then be performed to expose FD region. Low density n-type dopants can then be implanted into the exposed FD region by using the patterned first photoresist layer as a mask, thereby forming a low density n-type photodiode implant.

The first photoresist layer can then be removed, and then a first insulating layer composed of an oxide material and a second insulating layer composed of a nitride material can be sequentially formed on and/or over the entire surface of the substrate. The first insulating layer and the second insulating layer can be formed by sequentially depositing an oxide layer and a nitride layer through at least one of a chemical vapor deposition (CVD) process, a low pressure chemical vapor deposition (LPCVD). The oxide layer and the nitride layer can then be etched to form a spacer composed of an oxide layer and a nitride layer on both sides of the gate electrode. The oxide layer and the nitride layer can be etched through a dry etching process, e.g. an etch-back process.

After coating a second photoresist layer on and/or over the entire surface of the substrate, exposure and development process can then be performed to cover the photodiode region. A patterning process can then be performed to expose FD region. High density n+-type dopants can then be implanted into FD region using the patterned second photoresist layer as a mask, thereby forming an n+-type photodiode implant.

The second photoresist layer can then be removed, and a third photoresist layer coated on and/or over the entire surface of the substrate. The third photoresist can then be patterned through exposure and development process to expose only the photodiode region. $P^0$-type dopants can then be implanted using the patterned third photoresist layer as a mask, thereby forming a $P^0$-type photodiode implant on and/or over the surface of the substrate. The $P^0$ type dopants can be composed of a material containing boron (B), such as one of $BF_2$ or Boron.

The patterned third photoresist layer can then be reflowed at a temperature of about 100° C. to 300° C. The exposed gate electrode can then be covered through the reflow process for the third photoresist layer.

The exposed nitride layer can then be selective removed using the reflowed third photoresist layer as a mask. The nitride layer can be removed through a wet etching process.

Low density n-type dopants can then be implanted into the photodiode region of the substrate with ion implantation energy of about 100 KeV to 500 KeV by using the reflowed third photoresist layer as a mask, thereby forming a low density n-type photodiode implant.

The exposed portion of the gate electrode can then be covered with the reflowed third photoresist layer so that the gate electrode is safely blocked when performing the ion implantation for forming the low density n-type photodiode implant, thereby effectively preventing the ions from penetrating into the gate electrode. As a result, there is no change in the characteristics of the transistor, so that the CMOS image sensor can be effectively prevented from deteriorating.

When forming the low density n-type photodiode implant of the photodiode region, the dopant implantation can be performed with higher energy in such a manner that the low density n-type photodiode implant of the photodiode region is deeper than the low density n-type photodiode implant of FD region.

After removing the third photoresist layer, the substrate can then be subjected to a heat treatment process such as rapid thermal treatment, to diffuse the dopants in the n-type photodiode implant, the $P^0$-type photodiode implant, the n-type photodiode implant and the n+ type photodiode implant.

In accordance with embodiments, the image sensor can include a structure such that the transistor transmitting electrons can be designed to widen a contact region of the photodiode, and thus, the electron transmission can be enhanced. In turn, the overall performance of the image sensor can be improved, the photosensitivity enhanced and noise undesirable noise reduced.

Meaning, the structure of the transistor transmitting electrons can be designed to surround the photodiode so that the electron transfer capability in the edges of the photodiode is improved, thereby improving the performance of the device, increasing photosensitivity and reducing noise.

Figure 2:
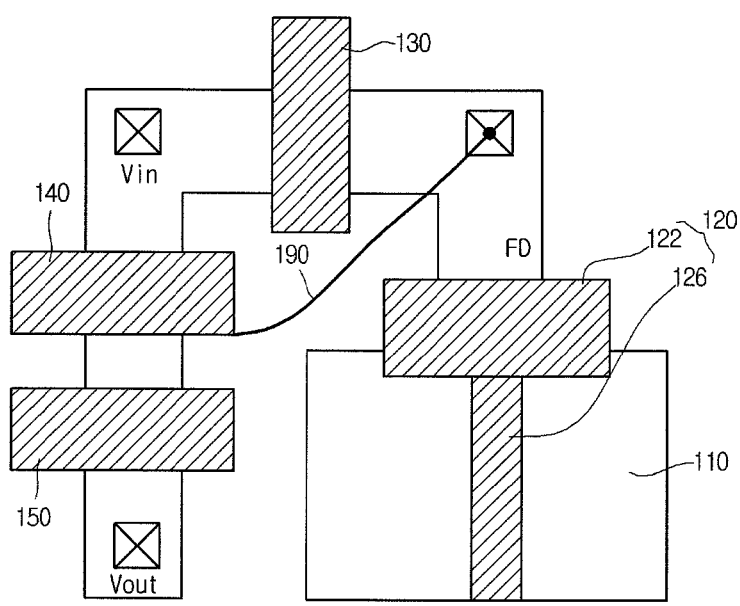

As illustrated in example FIG. 2, an image sensor in accordance with embodiments can include transistor 126 provided in a central portion of photodiode 110. Photodiode 110 can be formed when forming the gate insulating layer and the gate electrode of the transistor that transfers electrons in addition to transistor 122 provided between photodiode 110 and FD region. In accordance with embodiments, the image sensor illustrated in example FIG. 2 can adopt the technical characteristics of the image sensor illustrated in example FIG. 1.

In accordance with embodiments, the image sensor can include a widened contact region between the transistor transmitting electrons and the photodiode. Such a widened contact region can serve to enhance electron transmission, and thus, improve performance, increase photosensitivity and reduce noise. Meaning, the transistor transmitting electrons can be formed in a central portion of photodiode 110 so that the electron transfer capability in the central portion of photodiode 110 can be improved.

Figure 3:
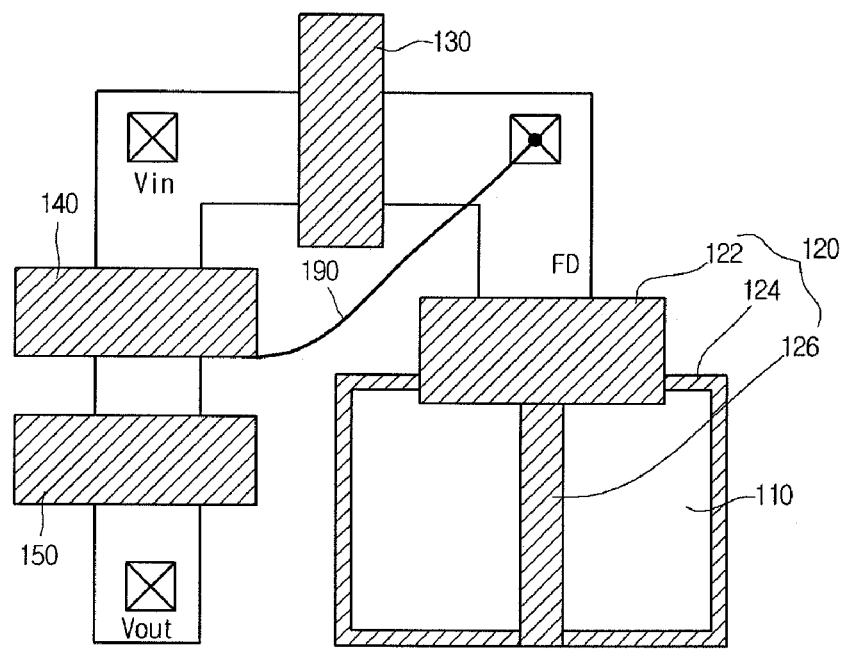

As illustrated in example FIG. 3, an image sensor in accordance with embodiments can include first transistor 124 surrounding photodiode 110 and second transistor 126 provided in the central portion of photodiode 110 formed when forming the gate insulating layer and the gate electrode of the transistor that transfers electrons in addition to third transistor 122 provided between photodiode 110 and FD region. In accordance with embodiments, the image sensor illustrated in example FIG. 3 can adopt the technical characteristics of the image sensors illustrated in example FIGS. 1 and 2.

In accordance with embodiments, the image sensor can include a widened contact region provided between the transistor transmitting electrons and the photodiode, in order to improve electron transmission, thereby improving performance, increasing photosensitivity and reducing noise.

As illustrated in example FIG. 4D, the transistor transmitting electrons can also be formed in the edge and central portions of photodiode 110 so that the electron transfer capability in the edge and central portions of photodiode 110 can be improved, thereby improving the performance of the device, increasing the sensitivity and reducing noises.

Accordingly, the image sensors provided in accordance with embodiments, the structure of the transistor transmitting electrons is designed to widen a contact region with the photodiode, and thus, improve electron transmission which in turn, can serve to improve performance, increase photosensitivity and reduce noise.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
a photodiode formed over a substrate to receive light and then generate signal charges based on the light; and
a transistor converting the signal charges into predetermined voltage and transmitting the voltage to an output terminal, wherein the transistor includes a first transistor region surrounding the photodiode and directly contacting the photodiode and a second transistor region extending through the first transistor region in a central portion of the photodiode and directly contacting the photodiode.

2. The apparatus of claim 1, wherein the transistor comprises a transfer transistor.

3. The apparatus of claim 1, wherein the transistor further comprises a third transistor region provided between the photodiode and a floating diffusion region and directly contacting the photodiode.

4. The apparatus of claim 1, wherein the second transistor region is provided between the photodiode and a floating diffusion region and directly contacting the photodiode.

5. An apparatus comprising:
a photodiode formed over a substrate; and
a transistor in connection with and directly contacting the photodiode wherein the transistor includes a first transistor region surrounding the photodiode and directly contacting the photodiode and the transistor includes a second transistor region extending through the first transistor region in a central portion of the photodiode and directly contacting the photodiode.

6. The apparatus of claim 5, wherein the transistor comprises a transfer transistor.

7. The apparatus of claim 5, wherein the transistor further comprises a third transistor region provided between the photodiode and a floating diffusion region and directly contacting the photodiode.

8. The apparatus of claim 5, wherein the first transistor region is provided between the photodiode and a floating diffusion region.

9. The apparatus of claim 5, wherein the first transistor region is extending through the photodiode.

10. The apparatus of claim 5, wherein the transistor comprises a third transistor region provided between the photodiode and a floating diffusion region.

11. A method comprising:
forming a photodiode over a substrate; and then
forming a transistor directly contacting the photodiode wherein the transistor includes a first transistor region surrounding the photodiode and directly contacting the photodiode and the transistor includes a second transistor region extending through the first transistor region in a central portion of the photodiode and directly contacting the photodiode.

12. The method of claim 11, wherein the transistor comprises a transfer transistor.

13. The method of claim 11, wherein the transistor further comprises a third transistor region provided between the photodiode and a floating diffusion region and directly contacting the photodiode.

14. The method of claim 11, wherein the first transistor region is provided between the photodiode and a floating diffusion region.

15. The method of claim 11, wherein the transistor comprises a third transistor region provided between the photodiode and a floating diffusion region.

* * * * *